(12) United States Patent
Chandran et al.

(10) Patent No.: US 6,552,471 B1
(45) Date of Patent: Apr. 22, 2003

(54) MULTI-PIEZOELECTRIC LAYER ULTRASONIC TRANSDUCER FOR MEDICAL IMAGING

(75) Inventors: Sanjay Chandran, Tempe, AZ (US); David Chartrand, Mesa, AZ (US)

(73) Assignee: Parallel Design, Inc., Tempe, AZ (US)

( * ) Notice: Subject to any disclaimer, the term of this patent is extended or adjusted under 35 U.S.C. 154(b) by 0 days.

(21) Appl. No.: 09/492,430

(22) Filed: Jan. 27, 2000

Related U.S. Application Data

(60) Provisional application No. 60/117,869, filed on Jan. 28, 1999.

(51) Int. Cl.[7] ............... H01L 41/047; H01L 41/083
(52) U.S. Cl. ............... 310/328; 310/365; 310/366
(58) Field of Search ............... 310/328, 331, 310/332, 365, 366, 334

(56) References Cited

U.S. PATENT DOCUMENTS

| | | | |
|---|---|---|---|
| 3,281,612 A | * 10/1966 | Hatschek | 310/366 |
| 3,281,613 A | * 10/1966 | Hatschek | 310/366 |
| 5,329,496 A | 7/1994 | Smith | 367/140 |
| 5,637,800 A | 6/1997 | Finsterwald et al. | 73/642 |
| 5,704,105 A | 1/1998 | Venkataramani et al. | 29/25.35 |
| 5,744,898 A | 4/1998 | Smith et al. | 310/334 |
| 5,834,880 A | 11/1998 | Venkataramani et al. | 310/334 |
| 5,958,285 A | * 9/1999 | Kawano et al. | 310/366 |
| 6,121,718 A | * 9/2000 | Mohr | 310/366 |

FOREIGN PATENT DOCUMENTS

| | | | |
|---|---|---|---|
| JP | 59-145583 | 8/1994 | H01L/41/08 |

* cited by examiner

*Primary Examiner*—Thomas M. Dougherty
(74) *Attorney, Agent, or Firm*—Snell & Wilmer, L.L.P.

(57) ABSTRACT

A transducer is tuned to a desired impedance by building piezoelectric assemblies of multiple layers, each layer acting as a parallel capacitor. Piezoelectric layers are preferably constructed by plating or otherwise placing a conducting perimeter around a piezoelectric substrate. Gaps are suitably formed in the conducting layer by dicing or otherwise to form distinct electrical conducting regions on each layer. Piezoelectric layers are then suitably placed such that positive and negative conducting regions on each layer contact positive and negative regions on other layers. Layers are suitably joined by epoxy or by any other joining technique.

32 Claims, 3 Drawing Sheets

US 6,552,471 B1

MULTI-PIEZOELECTRIC LAYER ULTRASONIC TRANSDUCER FOR MEDICAL IMAGING

Claims Priority of Provisional Application Serial No. 60/117,869 filed Jan. 28, 1999.

TECHNICAL FIELD OF THE INVENTION

This invention relates generally to ultrasonic transducers such as those used in medical imaging. More particularly, the invention relates to transducers with piezoelectric assemblies at having multiple piezoelectric substrates.

BACKGROUND OF THE INVENTION

Transducers are devices that convert electrical energy to mechanical energy, or vice versa. Transducers in audio loudspeakers, for example, convert electrical signals into mechanical vibrations that in turn create audible sound waves. Similarly, transducers are often used to generate high frequency ultrasonic waves for various applications such as medical imaging, non-destructive evaluation (NDE), non-invasive surgery, dentistry and the like.

Transducers generally create ultrasonic vibrations through the use of piezoelectric materials such as certain forms of crystals (e.g. quartz) or ceramic polymers. Piezoelectric materials vibrate in response to alternating voltages of certain frequencies applied across the material. U.S. Pat. No. 5,637,800 issued Jun. 10, 1997 to Finsterwald et al. and incorporated herein by reference, for example, discloses a transducer suitable for medical use that includes arrays of piezoelectric elements. Such a transducer is typically connected to electronics that drive the transducer via a coaxial cable or the like.

Piezoelectric elements are similar to common analog capacitors in that piezo elements generally include two electrodes separated by a piezoelectric material that functions as a dielectric. The overall capacitance of a transducer is dependent upon the area and the thickness of the piezo material. Because the piezo elements in many types of transducers (e.g. phased arrays, high density linear and curved arrays, high frequency linear arrays, multidimensional arrays and the like) are generally very small, such transducers generally exhibit relatively low capacitance. The low capacitance corresponds to a relatively high impedance compared to that of the drive electronics, which typically has an impedance on the order of 50–75 ohms. As is known in the art, the impedance mis-match between the transducer and the electronics results in inefficient transfer of electrical energy, undesirably high ringdown, excessive heat production (which can present a safety hazard if the transducer comes into contact with human skin), and the like. Hence, it is generally desired to match the impedance of the transducer to the impedance of the drive electronics. Impedance matching in this situation, however, can typically be quite difficult to accomplish in practice.

One method of decreasing the impedance of the transducer relative to the impedance of the electronics is to increase the capacitance of the transducer through the addition of external parallel capacitors or inductors. The addition of discrete elements, however, typically increases the cost, complexity and variability of the transducer. Other transducers have sought to reduce impedance by reducing the space between piezo elements (commonly called "kerf width") such that the total quantity of substrate used is increased. Reducing kerf width, however, places piezo elements closer to each other, thus increasing undesirable cross-talk and resonance between piezo elements of the transducer. The overall performance of such transducers is therefore degraded.

Another strategy for reducing transducer impedance involves creating the logical equivalent of parallel capacitors. One such method is disclosed by Richard L. Goldberg and Stephen W. Smith, "Multilayer Piezoelectric Ceramics for Two-Dimensional Array Transducers", IEEE TANSACTIONS ON ULTRASONICS, FERROELECTRIC, AND FREQUENCY CONTROL, Vol. 41, No. 5, September 1994, pp. 761–771, incorporated herein by reference. This reference discloses a piezoelectric element formed by placing green (i.e. unfired) ceramic between two electrodes with "fingers" that create additional capacitance. Such an element has several disadvantages in practice, however, in that it is generally difficult to manufacture and that the differentiation shrinkage (i.e. thermal contraction) between green ceramic and the electrode materials during the firing process frequently results in cracks in the piezo element. Moreover, the conducting material in the electrodes frequently diffuses into the ceramic during the firing process, thus degrading the performance of the transducer. It is therefore desired to create an efficient and easily-manufacturable transducer having an impedance that can be matched to that of the drive electronics.

SUMMARY OF THE INVENTION

A transducer is tuned to a desired impedance by building piezoelectric assemblies of multiple layers, each layer acting as a parallel capacitor. Piezoelectric layers are preferably constructed by plating or otherwise placing a conducting perimeter around a piezoelectric substrate. Gaps are suitably formed in the conducting layer by dicing or otherwise to form distinct electrical conducting regions on each layer. Piezoelectric layers may then be placed such that positive and negative conducting regions on each layer contact positive and negative regions on other layers. Layers may be suitably joined by epoxy or by any other joining technique.

BRIEF DESCRIPTION OF THE DRAWING FIGURES

Preferred exemplary embodiments of the present invention will hereinafter be described in conjunction with the appended drawing figures, wherein like numerals denote like elements and:

DESCRIPTION OF THE INVENTION

Figure 1:
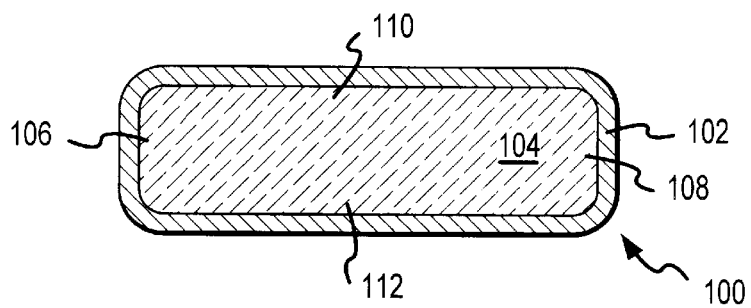
FIG. 1 is a cross-sectional view of an exemplary substrate upon which an electrical conducting layer has been placed.

Although the preferred embodiment of the invention disclosed herein is primarily discussed in terms of a piezoelectric assembly for a medical imaging transducer, any number of other embodiments fall within the ambit of the present invention. For example, the devices and techniques described herein could be used in conjunction with other types of transducer systems, such as audio loudspeakers, non-destructive evaluation, non-invasive surgeries, dentistry and the like. Moreover, the spatial relationships described herein and in the drawing figures are merely for illustrative purposes, and indeed many spatial arrangements could be formulated within the ambit of the present invention.

The impedance of a transducer is dependent upon the impedance of the various piezoelectric assemblies. By increasing the overall capacitance of the piezo assemblies, the impedance of the transducer is reduced. One technique for increasing the capacitance of each piezoelectric assembly is to create "layers" of capacitive elements that act as parallel capacitors. It can be readily shown that for a piezoelectric assembly of fixed area and depth, the total capacitance of the assembly increases with the square of the number of piezo layers making up the assembly. For example, a three-layer assembly generally exhibits a capacitance that is nine times the capacitance of a similarly sized single layer assembly. By adjusting the number of layers used in a piezoelectric assembly, the capacitance of the assembly is therefore adjusted and the overall impedance of the transducer can be suitably tuned to a desired value.

Figure 2:
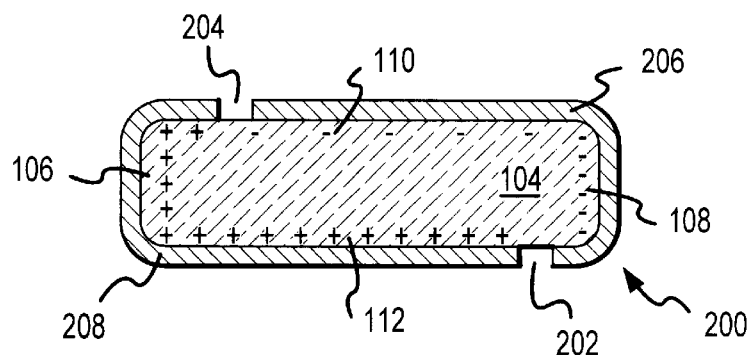
FIG. 2 is a cross-sectional view of an exemplary piezoelectric element.

With reference to FIGS. 1 and 2, a typical piezoelectric element (also referred to as a piezoelectric layer) suitably includes a substrate 104 and a conductive coating 102. Substrate 104 is made up of any suitable piezoelectric substrate material such as crystalline materials (e.g. quartz) or any of various forms of ceramic or polymer. A particularly suitable piezoelectric ceramic material is type 3203HD made by Motorola Ceramic Products of Albuquerque, N.M., which exhibits high density and strength characteristics that allow the cutting steps (described below) to be made without fracture of the individual elements. Substrate 104 is preferably shaped to be generally rectangular, although substrates of other geometric configurations could be formulated. As shown in FIG. 1, rectangular substrate 104 has a top 110, a bottom 112, a left side 106 and a right side 108. An exemplary substrate 104 has dimensions of approximately 13 mm×38 mm×0.175 mm, although of course substrates of any size could be used in alternate embodiments.

Substrate 104 may be fired (i.e. sintered or densified) prior to the application of conductive coating 102. By using fired ceramic (as opposed to so-called "green" ceramic, which is unfired), diffusion of electrode material into the substrate is avoided, and electrical and acoustic properties are thereby preserved. Additionally, the cracking observed in "green" elements due to substrate differentiation shrinkage and thermal contraction during firing may be avoided.

Conductive coating 102 suitably covers at least a portion of substrate 104 to provide electrical excitation to the piezo material. Coating 102 is a metal or other electrical conductor. Suitable coatings may include chromium, gold, silver, nickel, copper, aluminum, tin, various forms of solder, and the like. Alternatively, various conducting or non-conducting materials are suitably combined or formed in combination on substrate 104 to create conductive coating 102. In various embodiments, gaps 202 and 204 are made in coating 102 to form two electrically isolated conductors (also referred to as electrodes) 206 and 208.

With reference to FIG. 1, individual ultrasonic piezo elements may be made in the following manner. A selected substrate material is made flat (e.g. by grinding) and suitably cut to a rectangular shape to form a substrate 104. Conducting layer 102 may be applied to substrate 104 by any method, such as plating, spray coating, vacuum deposition or any other metalization technique. An exemplary method of applying conductive coat 102 involves first etching the surfaces of substrate 104 with an acid solution (such as a 5% fluroboric acid solution) and then plating substrate 104 with electroless nickel using conventional plating techniques. The plating material may be made to extend completely around four adjoining surfaces of substrate 104 such that a perimeter of the substrate is suitably covered with conductive material and two faces (corresponding to the front and back faces parallel to the plane shown in FIGS. 1 and 2) of substrate 104 are left uncovered. Alternatively, substrate 104 is covered over all or nearly all of its surface area. In exemplary embodiments, a copper layer of approximately two micron thickness is suitably electroplated or otherwise placed onto the first nickel layer (which is approximately 1 micron thick) followed by a thin layer of electroplated gold (which preferably has a thickness of slightly less than 0.1 microns) to protect against corrosion. Other conductive coatings 102 and methods of applying the conductive coating could be formulated within the ambit of the present invention.

Two gaps 202 and 204 in coating 102 extend to the surface of piezoelectric substrate 104 to electrically isolate various regions of conductive layer 102 into two electrodes 206 and 208. Any type of saw or other gap-forming mechanism is employed to form gaps 202 and 204. For example, gaps 202 and 204 can be created by placing a tape or layer of any other material on substrate 104 in the locations where gaps 202 and 204 are desired such that conductive material is easily removable after plating, or such that conductive material does not adhere to substrate 104 in certain locations. In preferred embodiments, however, a wafer-dicing saw is used to create two cuts through conductive layer 102 to substrate 104.

Gaps 202 and 204 suitably form a rear surface electrode 208 and a separate front surface electrode 206. Each electrode 206 and 208 may include a wrap-around end that extends around a side of substrate 104 to the opposing side. Stated another way, rear surface electrode 208 may extend around end 106 to a portion of front surface 110 of substrate 104. Similarly, front surface electrode 206 may extend around- side 108 to overlap the rear face 112 of substrate 104. In various embodiments, the wrap-around ends extend approximately 1 mm along each side of the respective opposing surface, or as appropriate.

Electrodes 206 and 208 in piezo element 200 are thereby separated electrically by piezoelectric substrate 104, which preferably has a capacitance of approximately 400 pF at 1 kHz. When an electric potential having the proper frequency characteristics for the particular substrate material is applied across electrodes 206 and 208, piezo substrate material 104 vibrates, thus generating sound waves of a comparable frequency. For example, an exemplary embodiment using 3203HD ceramic generates ultrasound waves at a center frequency of 3.5 MHZ. A capacitance that is proportional to the area of the two electrodes and inversely proportional to the distance between the electrodes is also created. Piezo element 200 may therefore be logically represented as a capacitor in modeling diagrams.

Figure 3:
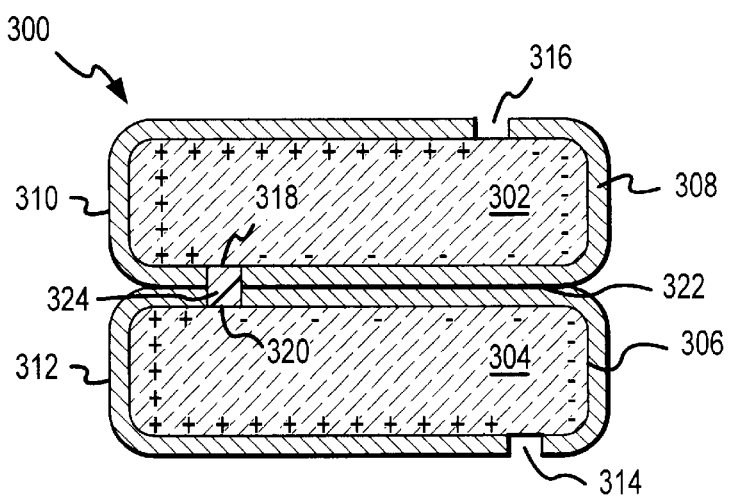
FIG. 3 is a cross-sectional view of an exemplary piezoelectric assembly.

With reference to FIG. 3, an exemplary piezoelectric assembly 300 is suitably formed from two or more piezoelectric layers 200 such as those made in accordance with the methods described above. As can be readily observed from FIG. 3, front surface electrode 306 of element 304 suitably touches rear surface electrode 308 of element 302 to form a common electrical node (indicated by "−" signs in FIG. 3). Similarly, the overlap portion of rear surface electrode 312 of element 304 suitably touches the overlap portion of front surface electrode 310 of element 302, thus forming a second electrical node (indicated by the "+" signs in FIG. 3). In various embodiments, a trench 324 isolating the first electrical node from the second electrical node is suitably formed by gaps 318 and 320.

The various piezo layers of piezo assembly 300 are suitably joined with an adhesive, by mechanical means, or by any other joining method. In an exemplary embodiment, an epoxy adhesive bonds the layers. A suitable epoxy may be Epotek Model 330 available from Epotek Inc., although of course any suitable epoxy, bonding material or the like may be used in various embodiments. A coating of epoxy (such as a relatively thin coat of approximately 3 microns) may be suitably applied between the piezo layers and allowed to settle, thus forming a bond between the layers. In preferred embodiments, trench 324 is also filled with epoxy.

Piezoelectric assembly 300 is then suitably incorporated into a transducer element in any manner, such as according to the manner disclosed in U.S. Pat. No. 5,637,800 (previously incorporated by reference). Alternatively, piezoelectric assembly 300 can be suitably diced to create a multi-fingered piezo assembly. In such embodiments, a dicing saw or other cutting device is used to create cuts from the top or bottom of piezo assembly 300 though substrate 104. In an exemplary embodiment, the cuts leave about 50 microns of material to the opposing face. Diced assemblies suitably allow the transducer to curve, thus facilitating ultrasonic focusing as described below.

Figure 4:
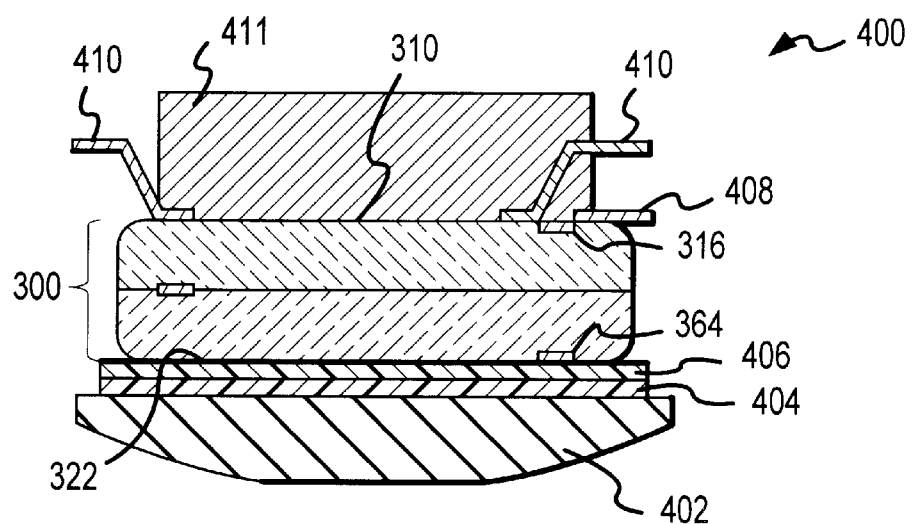
FIG. 4 is a cross-sectional view of an exemplary transducer.

Referring now to FIG. 4, a piezo element suitable for use in a transducer 400 is shown. The multi-layer piezoelectric element 300 is preferably attached to one or more acoustic matching layers 404 and 406. Acoustic matching layers 404 and 406 are each suitably formed of a polymer or polymer composite material, or of any other suitable damping material. In an exemplary embodiment, the epoxy material making up acoustic matching layer 406 is selected to be an epoxy having an intermediate acoustic impedance value between that of ceramic substrate 300 and the second acoustic matching layer 404. Material may be suitably cast and ground to a uniform thickness equal to approximately one-quarter wavelength of the desired operating frequency, as measured by the speed of sound in the particular material selected. The speed of sound in the human body is approximately 1500 m/s, and an exemplary matching layer has a corresponding thickness of approximately 0.210 mm. An exemplary material for forming first matching layer 406 is Compound 1420 available from Bacon Industries, although other materials could be used in alternate embodiments.

The second acoustic matching layer 404 is similarly chosen to exhibit an intermediate acoustic impedance value between that of the first acoustic matching layer 406 and that of the material that the transducer is placed in contact with (e.g. the human body). In a particularly preferred embodiment, the second acoustic matching layer 404 is an epoxy similar to that used for the first acoustic matching layer 406. In various embodiments the material may be suitably cast and ground to a uniform thickness equal to approximately one-quarter wavelength of the desired operating frequency as measured by the speed of sound in the particularly epoxy or other materials selected. A preferred embodiment uses a thickness of approximately 0.141 mm.

The acoustic matching layers 404 and 406 may be fastened to substrate 300 by a thin layer of epoxy 322, or by any other suitable joining mechanism. In various embodiments, the epoxy used to join substrate 300 to matching layers 404 and 406 is identical to the epoxy used in layer 322 to join the multiple layers of the substrate.

A backing material 411 may be placed on substrate 300 opposite the acoustic matching layers. Suitable backing materials include polymers such as polyurethane filled with, e.g., aluminum oxide or tungsten oxide. Backing material 411 may be cast or otherwise applied over the ceramic layer to encapsulate the transducer elements and the corresponding signal and ground leads. The backing material may absorb and/or isolate the sound waves generated from the ceramic layer in order to preserve appropriate bandwidth for the particular transducer desired.

Similarly, a facing material 402 is preferably placed on the front face of the transducer next to acoustic matching layer 404. Any suitable facing material such as silicon rubber or polyurethane can be used. Various forms of facing materials may act as lenses to focus the acoustic waves to a particular focal point. Facing materials may additionally or alternatively serve as a protective seal. In various alternative embodiments, the acoustic matching layers and/or piezo layers are suitably curved, angled or otherwise fashioned to focus the acoustic beam produced by the transducer. An example of a transducer having a curved piezo layer is disclosed in U.S. Pat. No. 5,637,800 (previously incorporated by reference), and the techniques of that reference may be easily combined with the devices and methods disclosed herein.

Signal leads 410 are also placed in contact with electrode 310 on substrate 300. Leads are attached to a control mechanism (not shown) to provide electrical energy to electrode 310. Similarly a ground lead 408 is attached to electrode 308 in order to provide electric potential between the two electrodes 310 and 308, thus forming a capacitor. Although two positive leads 410 are shown in FIG. 4, these leads are redundant and one lead may be omitted in alternate embodiments of the invention. Although terms such as "positive", "negative" and "ground" are used herein to facilitate description, alternate embodiments reverse the polarity described above. In particularly preferred embodiments, an AC potential is applied across leads 408 and 410. The leads are suitably connected to the two electrical nodes made up of the various electrodes of the piezoelectric layers such that electrical energy is preferably provided to each layer of the piezoelectric assembly.

Figure 5:
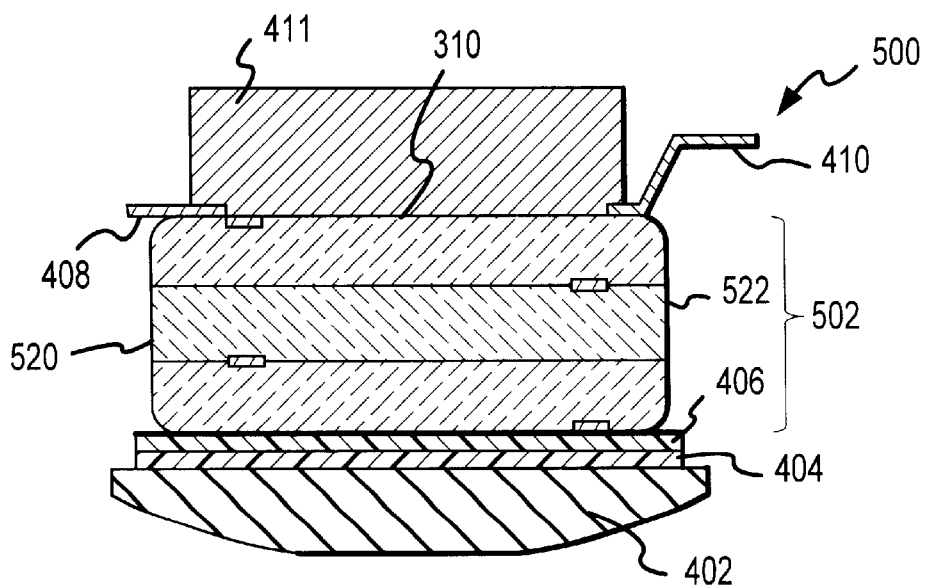
FIG. 5 is a cross-sectional view of a second exemplary embodiment of a transducer.

With reference now to FIG. 5, an alternate embodiment of a transducer 500 suitably includes multiple piezoelectric layers assembled to create a piezoelectric assembly 502 having two electrical nodes 520 and 522 as described above. Although three "levels" of piezo elements are shown in FIG. 5, any number of levels could be used in alternate embodiments to "tune" the capacitance of transducer 500 to any desired level. Leads 408 and 410 may be attached to electrical nodes 520 and 522, as appropriate. It will be appreciated that any number of piezo layers or assemblies could be combined to form transducer 500, as described more fully below.

Figure 6:
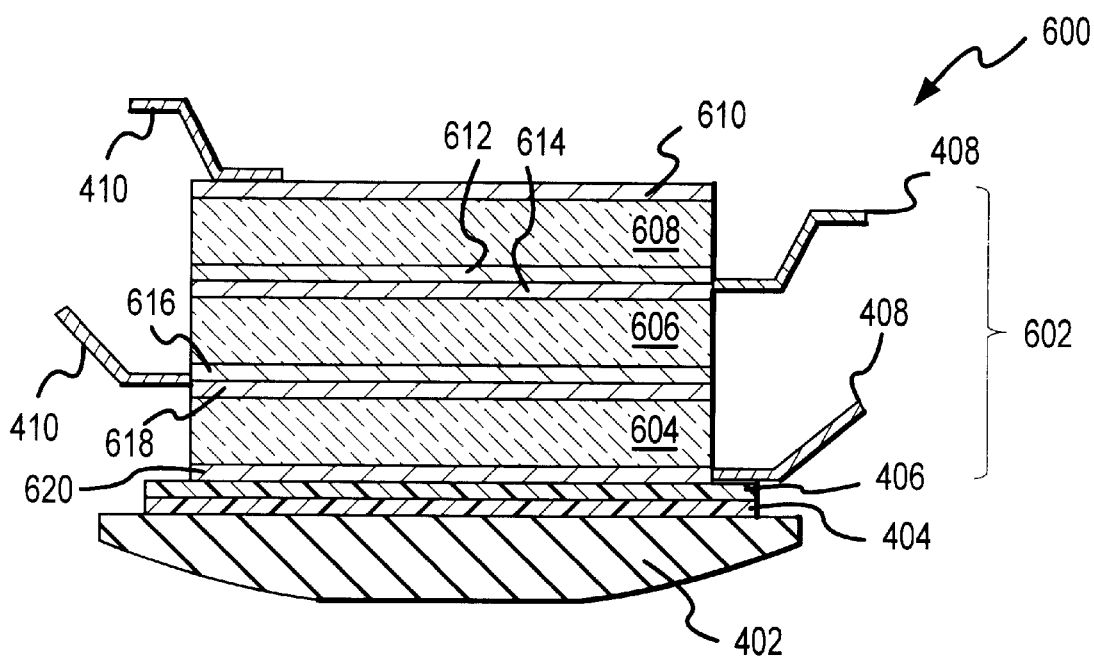
FIG. 6 is a cross-sectional view of a third exemplary embodiment of a transducer.

FIG. 6 is a cross-sectional view of an alternate embodiment of a transducer 600. With reference to FIG. 6, a transducer 600 may be prepared with a piezoelectric assembly 602 that includes a two or more piezoelectric layers 604, 606 and 608, as appropriate. Piezoelectric layers 604, 606 and 608 may be formulated as described above in conjunction with FIGS. 1–3, for example, or through any other suitable technique. As seen in FIG. 6, however, each layer 604, 606 and 608 is coated with a conducting material only on the upper and lower faces of the substrate. Because the two faces are electrically isolated from each other by the substrate material itself, the embodiment may not require the notches described above for electrical isolation. The various layers may be arranged such that the upper face of one layer (e.g. layer 604) is placed in contact with the bottom of another layer (e.g. layer 606) to create a common electrical node between the two layers. Leads 408 and 410 may be attached to each electrical node as appropriate.

Transducers as described above (e.g. in conjunction with FIGS. 4–6) exhibit a number of marked advantages over prior art transducers. Most notably, multi-layer substrate 300 allows the electrical impedance of the transducer to be reduced in accordance with the number of layers imposed. It has been observed in practice that the impedance of the transducer decreases inversely as the square of the number of layers. As such, improved matching with electronic system transmit and receive characteristics is facilitated by "tuning" the piezo assembly with the desired number of joined piezo layers. The matched impedance allows more efficient operation of the transducer, because transducer gain is maximized between the transducer/electronics interface when impedance is properly matched. A multi-layer transducer therefore exhibits a higher sensitivity than a comparable single layer transducer for a given transmit voltage. Similarly, a multi-layer transducer has a higher signal-to-noise ratio than a single layer transducer and a higher efficiency of electrical energy conversion to acoustic energy, thus allowing for less electrical energy to be input into the transducer to result in an equivalent acoustic energy output. By reducing the amount of electrical energy required, less heat is generated in the transducer thus causing a reduction in the temperature of the transducer face. Since the transducer face is typically placed in contact with a patient, for example, the lower heat amount allows the transducer design to be in accordance with stringent FDA standards relating to temperature. Hence, an improved transducer is created.

The corresponding structures, materials, acts and equivalents of all elements in the claims below are intended to include any structure, material or acts for performing the functions in combination with other claimed elements as specifically claimed. The scope of the invention should be determined by the appended claims and their legal equivalents, rather than by the examples given above. Additionally, the various steps included in any method claims could be undertaken in any order or combined in any way while still falling under the ambit of the present invention.

What is claimed is:

1. A piezoelectric assembly for an ultrasonic transducer, the assembly comprising:
    a first piezo layer comprising a first substrate having a first conductive coating covering the perimeter of said first substrate, said first conductive coating having a first electrode and a second electrode electrically isolated from each other by first and second cuts in said first conductive coating; and
    a second piezo layer disposed adjacent to said first piezo layer, the second piezo layer comprising a second substrate having a second conductive coating covering the perimeter of said second substrate, said second conductive coating having a third electrode and a fourth electrode electrically isolated from each other by third and fourth cuts in said second conductive coating; and
    wherein said first and second piezo layers are affixed together with an adhesive such that said first electrode and said third electrode form a first electrical node and said second and fourth electrodes form a second electrical node, said first and second electrical nodes defining first and second capacitors across said first and second substrates such that the total impedance of said piezoelectric assembly is less than the impedance of said first piezo layer.

2. The piezoelectric substrate of claim 1 wherein said first substrate and said second substrate comprise fired ceramic.

3. A multilayered piezoelectric transducer assembly comprising:
    a first piezoelectric layer having a first electrode, a second electrode and a first dielectric material disposed therebetween, wherein said first and second electrodes are electrically isolated from each other by first and second cuts in a first conductive coating substantially covering the perimeter of said first dielectric material;
    a second piezoelectric layer having a third electrode, a fourth electrode and a second dielectric material disposed therebetween, wherein said thirds and fourth electrodes are electrically isolated from each other by third and fourth cuts in a second conductive coating substantially covering the perimeter of said second dielectric material;
    an adhesive bonding said first and second piezoelectric layers to each other such that said second cut aligns with said third cut such that said first and third electrodes form a first electrical node and such that said second and fourth electrodes form a second electrical node.

4. The piezoelectric transducer of claim 3 wherein said first and second dielectric layers comprise fired ceramic.

5. The piezoelectric transducer of claim 3 wherein said transducer has a total capacitance substantially equal to the sum of the capacitances of said first and second piezoelectric layers.

6. The piezoelectric transducer of claim 3 further comprising:
    a third piezoelectric layer having a fifth electrode and a sixth electrode forming a third capacitor; and
    a second adhesive bonding said third piezoelectric layer to said second piezoelectric layer such that said first, third and fifth electrodes are in electrical communication and such that said second, fourth and sixth electrodes are in electrical communication with each other.

7. The piezoelectric transducer of claim 6 wherein said transducer has a total capacitance substantially equal to the sum of the capacitances of said first, second and third piezoelectric layers.

8. The piezoelectric transducer of claim 4 further comprising:
    a third piezoelectric layer having a fifth electrode and a sixth electrode forming a third capacitor; and
    a second adhesive bonding said third piezoelectric layer to said second piezoelectric layer such that said first, third and fifth electrodes are in electrical communication and such that said second, fourth and sixth electrodes are in electrical communication with each other.

9. The piezoelectric transducer of claim 8 wherein said transducer has a total capacitance substantially equal to the sum of the capacitances of said first, second and third piezoelectric layers.

10. A piezoelectric assembly, the assembly comprising:
    a first piezoelectric substrate substantially encompassed by a first coating, the first coating forming at least a first electrode and at least a second electrode thereon, the first electrode being electrically isolated from the second electrode;
    a second piezoelectric substrate substantially encompassed by a second coating, the second coating forming at least a third electrode and at least a fourth electrode thereon, the third being electrically isolated from the fourth electrode;

the first piezoelectric substrate being adjacent to the second piezoelectric substrate, the second electrode being electrically influenced by the third electrode.

11. The assembly of claim 10, the first electrode being in opposite facing relationship with the fourth electrode.

12. The assembly of claim 11, the first electrode including a wrap-around end extending around a side of the first substrate.

13. The assembly of claim 12, the second electrode including a wrap-around end extending around a side of the second substrate.

14. The assembly of claim 13, the first coating and the second coating further comprising conductive material.

15. The assembly of claim 14, the first substrate being coupled to the second substrate.

16. The assembly of claim 15, the first substrate being coupled to the second substrate by an adhesive conductive bonding material.

17. The assembly of claim 16 further comprising at least a first lead in electrical communication with the first substrate, and at least a second lead in electrical communication with the second substrate.

18. The assembly of claim 12, the first lead being in the same planar surface as the second lead.

19. The assembly of claim 12 further comprising at least a third piezoelectric substrate substantially encompassed by a third coating, the third coating forming at least a fifth electrode and at least a sixth electrode thereon, the fifth electrode being electrically isolated from the sixth electrode, the third substrate being adjacent to the second substrate, the fourth electrode being in facing relationship with the fifth electrode.

20. The assembly of claim 19, the at least first electrode being in opposite facing relationship with the at least sixth electrode.

21. The assembly of claim 20, the at least fifth electrode including a wrap-around end extending around a side of the substrate.

22. The assembly of claim 20, the at least sixth electrode including a wrap-around end extending around a side of the substrate.

23. The assembly of claim 22, the first lead being in the same planar surface as the second lead.

24. A piezoelectric assembly comprising:

at least a first substrate substantially encompassed by a first coating, the first coating comprising a first front surface electrode and a first rear surface electrode;

at least a second substrate substantially encompassed by a second coating, the second coating comprising a second front surface electrode and a second rear surface electrode, the first rear surface electrode being in electrical communication with the second front surface electrode, the first front surface electrode being in electrical communication with the second rear surface electrode;

at least a first lead in electrical communication with the first front surface; and at least a second lead in electrical communication with the first rear surface.

25. The assembly of claim 24, the at least first lead being in the same planar surface as the at least second lead.

26. The assembly of claim 25 further comprising backing material in communication with the first front surface electrode.

27. The assembly of claim 26 further comprising at least one acoustic matching layer in facing relationship with the second rear surface electrode.

28. A piezoelectric assembly comprising:

a first piezoelectric substrate having a first impedance, the first piezoelectric substrate substantially encompassed by a conductive first coating, the first coating forming a first electrode and a second electrode thereon, the first electrode being electrically isolated from the second electrode by a gap in the conductive coating;

a second piezoelectric substrate having a second impedance, the second substrate substantially encompassed by a second conductive coating, the second coating forming a third electrode and a fourth electrode thereon, the third electrode being electrically isolated from the fourth electrode by a second gap in the second conductive coating; and the first piezoelectric substrate being coupled to the second piezoelectric substrate, the second electrode being electrically influenced by the third electrode, such that the total impedance of the first impedance and the second impedance is less than the first impedance.

29. The assembly of claim 28, the first substrate being coupled to the second substrate by an adhesive conductive bonding material.

30. The assembly of claim 29 further comprising at least a first lead in electrical communication with the first substrate, and at least a second lead in electrical communication with the second substrate.

31. The assembly of claim 30, the first lead being in the same planar surface as the second lead.

32. The assembly of claim 31 further comprising a third piezoelectric substrate having a third impedance, the third substrate substantially encompassed by a third conductive coating, the third coating forming a fifth electrode and a sixth electrode thereon, the fifth electrode being electrically isolated from the sixth electrode, the second piezoelectric substrate being coupled to the third piezoelectric substrate, the fourth electrode being electrically influenced by the fifth electrode, the total impedance of the first impedance, second impedance and third impedance being less than the first impedance.

* * * * *